US 7,485,932 B2

(12) United States Patent
Thapar

(10) Patent No.: US 7,485,932 B2
(45) Date of Patent: Feb. 3, 2009

(54) ACCUFET WITH SCHOTTKY SOURCE CONTACT

(75) Inventor: Naresh Thapar, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 511 days.

(21) Appl. No.: 11/185,319

(22) Filed: Jul. 20, 2005

(65) Prior Publication Data

US 2006/0017078 A1 Jan. 26, 2006

Related U.S. Application Data

(60) Provisional application No. 60/589,991, filed on Jul. 20, 2004.

(51) Int. Cl.
*H01L 29/80* (2006.01)
(52) U.S. Cl. .............. 257/369; 257/213; 257/284; 257/330; 257/331; 257/332; 257/E29.121; 257/E29.271
(58) Field of Classification Search ............. 257/213, 257/284, 330–332, 336, 369
See application file for complete search history.

(56) References Cited

U.S. PATENT DOCUMENTS

| 5,679,966 | A  | * | 10/1997 | Baliga et al. | 257/139 |
| 5,998,833 | A  |   | 12/1999 | Baliga | |
| 6,351,018 | B1 |   | 2/2002 | Sapp | |
| 6,586,800 | B2 | * | 7/2003 | Brown | 257/330 |
| 6,649,975 | B2 |   | 11/2003 | Baliga | |
| 6,710,403 | B2 |   | 3/2004 | Sapp | |
| 2006/0033154 | A1 | * | 2/2006 | Cao et al. | 257/332 |
| 2006/0049454 | A1 | * | 3/2006 | Thapar | 257/330 |
| 2007/0210356 | A1 | * | 9/2007 | Henson | 257/288 |

OTHER PUBLICATIONS

U.S. Appl. No. 11/110,468, filed Apr. 20, 2005, ACCUFET With Source Shield Electrode.
U.S. Appl. No. 11/110,467, filed Apr. 20, 2005, MOSgated Power Semiconductor Device With Source Field Electrode.

* cited by examiner

*Primary Examiner*—Ahmed Sefer
(74) *Attorney, Agent, or Firm*—Ostrolenk, Faber, Gerb & Soffen, LLP

(57) ABSTRACT

An accumulation mode FET (ACCUFET) which includes an insulated gate, an adjacently disposed insulated source field electrode, and a source contact that makes Schottky contact with the base region of the ACCUFET.

11 Claims, 1 Drawing Sheet

US 7,485,932 B2

ACCUFET WITH SCHOTTKY SOURCE CONTACT

RELATED APPLICATION

This application is based on and claims benefit of U.S. Provisional Application No. 60/589,991, filed on Jul. 20, 2004, entitled Mid Voltage Power MOSFET, to which a claim of priority is hereby made and the disclosure of which is incorporated by reference.

FIELD OF INVENTION

The present invention is in the field of MOSgated power devices, and more particularly relates to accumulation mode FETs (ACCUFETs).

BACKGROUND OF THE INVENTION

Power semiconductor devices such as power MOSFETs are prevalent in power supply applications. For example, power MOSFETs are used as synchronous rectifiers in power supply circuits.

Many power MOSFETs are known to include a body diode, which conducts current under reverse voltage conditions. The body diode of a power MOSFET exhibits relatively high resistance to current and thus dissipates much power. To avoid this undesirable consumption of power it is known to connect a Schottky diode across the body diode of a power MOSFET when, for example, the MOSFET is used as a synchronous rectifier, in order to reduce power loss during reverse voltage conditions. According to one conventional concept, for example, a discrete power MOSFET and a discrete Schottky diode are copackaged. According to another known concept a power MOSFET and a Schottky diode are formed in a single die to obtain a monolithic integrated device. One such device is illustrated by U.S. Pat. No. 6,351,018 ('018 patent). In that device, the source contact and the drift region of the MOSFET form a schottky diode. Thus, in a device according to the '102 patent the drift region has to be configured in order to make a Schottky device. To be specific, factors such as the resistivity of the drift region have to be designed for a Schottky device, which may not be desirable as it may increase the overall resistance of the device.

SUMMARY OF THE INVENTION

A power semiconductor device according to the present invention is a monolithic, integrated device which includes an ACCUFET and a Schottky diode formed in a single die.

As is well known, the base region of an ACCUFET is the same conductivity as its drift region and its source regions. That is, unlike a power MOSFET, an ACCUFET does not include a PN junction.

In a device according to the present invention, the source contact of the ACCUFET makes a Schottky contact with the base region of the device to form a Schottky diode. As a result, the characteristics of the drift region need not be modified to obtain a Schottky diode. Given that the conductivity of the drift region is no longer restricted by the need to make a Schottky contact, the drift can be made more conductive if desired.

According to an aspect of the present invention, a device according to the present invention includes source field electrodes which function to deplete the drift region. Thus, the drift region can be made more conductive without sacrificing the breakdown voltage capability of the device.

Other features and advantages of the present invention will become apparent from the following description of the invention which refers to the accompanying drawings.

DETAILED DESCRIPTION OF THE FIGURES

Figure 1:
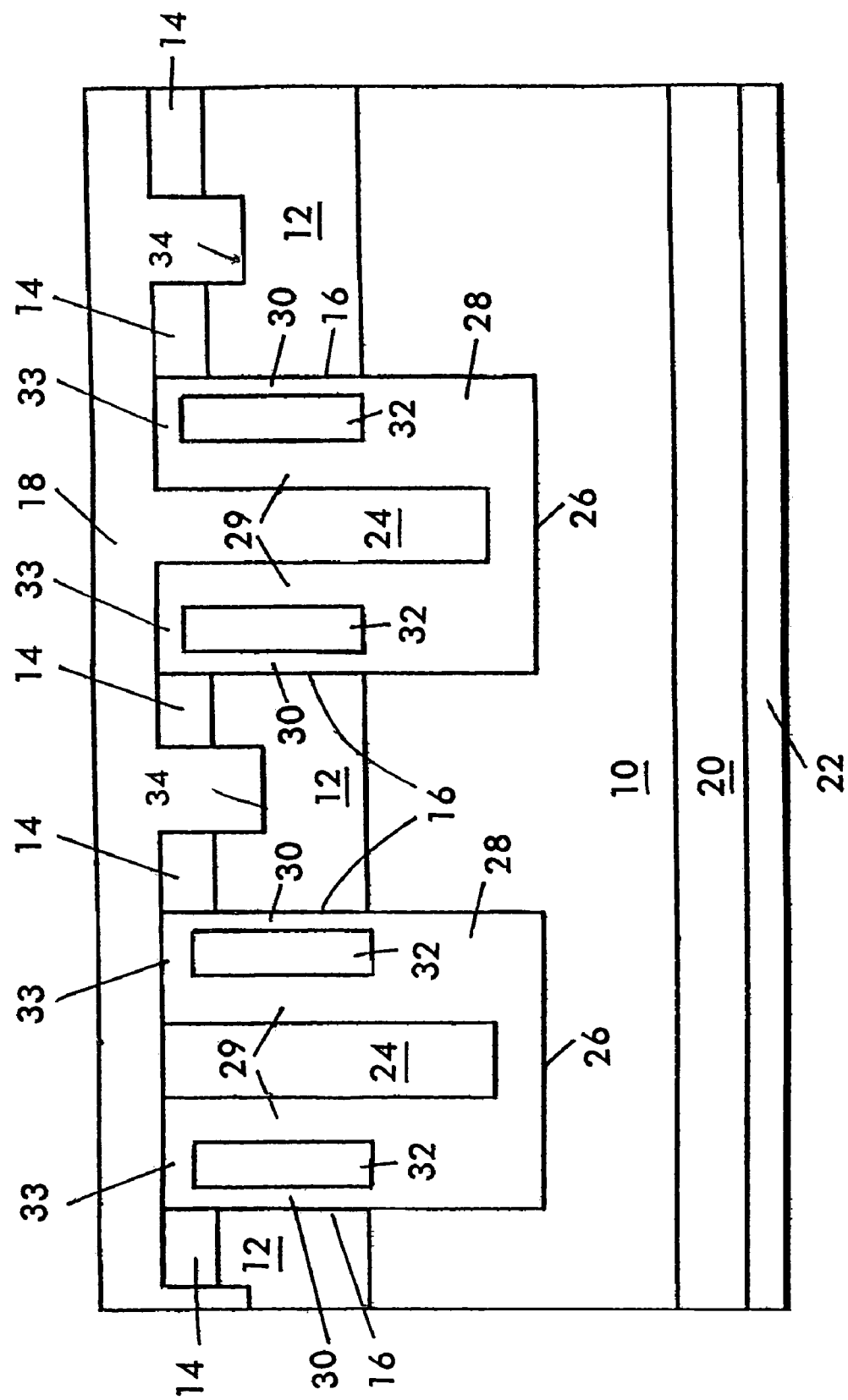
FIG. 1 schematically shows a cross-sectional view of a portion of the active region of a MOSgated device according to an embodiment of the present invention.

Referring to FIG. 1, a power semiconductor device according to the first embodiment of the present invention is an ACCUFET which includes drift region 10 of one conductivity; base region 12 of one conductivity; source region 14 of one conductivity; and source contact 18 ohmically connected to source region 14 and making Schottky contact with base region 12. A device according to the present invention further includes a plurality of insulated gate structures 16 each disposed within a respective trench 26. Each insulated gate 16 is adjacent base region 12 and includes gate electrode 32, gate insulator 30 disposed between gate electrode 32 and base region 12, and insulation cap 33 disposed between gate electrode 32 and source contact 18.

In the preferred embodiment of the present invention, drift region 10 is disposed over semiconductor substrate 20, and includes drain contact 22 which is electrically connected to substrate 20.

Furthermore, a device according to the present invention includes a plurality of source field electrodes 24 each disposed within a respective trench 26 and extending to a depth below gate electrodes 32. Each source field electrode 24 is insulated from drift region 10 and an adjacently disposed gate electrode 32. Specifically, an insulation body 28 insulates each source field electrode 24 from drift region 10, and insulation walls 29 insulate each source field electrode 24 from laterally disposed gate electrodes 32. Insulation body 28 in each trench 26 is preferably thicker than gate insulation 30 at least at the sidewalls and the bottom of trench 26. Thus, each gate structure 16 can be said to include gate insulation 30 and an insulation body at the bottom of its gate electrode 32 that is thicker than its gate insulation 30. It should be noted that in the embodiment shown by FIG. 1 insulated gates 16 and insulated source field electrodes reside within a common trench 26 and are laterally adjacent one another. Preferably, a source field electrode 24 is disposed between two insulated gate structures 16 in a common trench.

Source field electrodes 24 are electrically connected to source contact 18, and function to deplete drift region 10, thereby improving the breakdown voltage of the device. As a result, drift region 10 can be made less resistive without adversely affecting the breakdown voltage.

It should be noted that source contact 18 reaches base region 12 through recesses 34. Specifically, each recess 34 is formed to reach a depth below source regions 14 and to terminate in base region 12, and source contact 18 makes Schottky contact with base region 12 inside each recess 34. Also, each recess 34 is spaced from insulated gates 16.

It should be further noted that a device according to the present invention could be devised without recesses 34, in which case base region 12 would be configured to reach through source regions 14 to source contact 18.

In the preferred embodiment of the present invention, drift region 10, base region 12 and source regions 14 are formed in an epitaxially formed silicon, substrate 20 is a silicon substrate, oxide caps 33, gate insulations 30, and insulation bodies 28 are composed of silicon dioxide, gate electrodes 32 and source field electrodes 24 are composed of conductive polysilicon, and source contact 18 and drain contact 22 are composed of any suitable metal such as aluminum or aluminum silicon.

Also, substrate 20, drift region 10, base region 12 and source regions 14 are of N-type conductivity in the preferred embodiment. Preferably drift region 10 can be graded to improve breakdown voltage and Rdson.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An integrated MOSgated power semiconductor device comprising:
   a drift region of one conductivity;
   a base region of said one conductivity above said drift region;
   a source region of said one conductivity above said base region;
   a first insulated gate adjacent said base region;
   a second insulated gate adjacent said base region;
   an insulated source field electrode adjacent said drift region and laterally adjacent said first and second insulated gates, said insulated source field electrode including a source field electrode; and
   a source contact making ohmic contact with said source region, said source field electrode, and Schottky contact with said base region; wherein said first insulated gate, said second insulated gate and said insulated source field electrode are disposed in a common trench.

2. A device according to claim 1, further comprising a substrate of the same conductivity as said drift region, wherein said drift region is formed over said substrate.

3. A device according to claim 2, further comprising a drain contact electrically connected to said substrate.

4. A device according to claim 1, wherein said insulated source field electrode extends to a depth below that of said insulated gate electrode.

5. A device according to claim 1, wherein said source field electrode is comprised of conductive polysilicon.

6. A device according to claim 1, wherein said insulated gate includes a gate insulator, a gate electrode, and an insulation body at a bottom of said gate electrode, said gate insulator being interposed between said base region and said gate electrode, and said insulation body being thicker than said gate insulator.

7. A device according to claim 1, further comprising a recess extending to a depth below said source region and terminating in said base region, wherein said source contact makes Schottky contact with said base region inside said recess.

8. A device according to claim 7, wherein said recess is spaced from said insulated gate.

9. An integrated MOSgated power semiconductor device comprising:
   an accumulation mode FET having an insulated gate, an insulated source field electrode laterally adjacent said insulated gate, a source contact and a base region;
   a Schottky diode, said Schottky diode being formed by a Schottky contact between said source contact and said base region; and
   another insulated gate, wherein said insulated gate, said another insulated gate and said insulated source field electrode are disposed in a common trench, and wherein said insulated source field electrode is disposed between said insulated gates, wherein said Schottky diode and said accumulation mode FET share a drift region, and wherein said insulated source field electrode is adjacent said drift region.

10. A device according to claim 9, wherein said insulated source field electrode and said insulated gate are disposed in a common trench.

11. A device according to claim 9, further comprising a recess extending to a depth below said source region and terminating in said base region, wherein said source contact makes Schottky contact with said base region inside said recess.

* * * * *